(12) United States Patent
Wu et al.

(10) Patent No.: US 8,097,899 B2
(45) Date of Patent: Jan. 17, 2012

(54) LIGHT EMITTING DIODE

(75) Inventors: Chia-Hao Wu, Taipei (TW);
Shun-Chung Cheng, Sindian (TW)

(73) Assignees: Silitek Electronic (Guangzhou) Co., Ltd., Guangzhou (CN); Lite-On Technology Corporation, Taipei (TW)

( * ) Notice: Subject to any disclaimer, the term of this patent is extended or adjusted under 35 U.S.C. 154(b) by 162 days.

(21) Appl. No.: 12/566,898

(22) Filed: Sep. 25, 2009

(65) Prior Publication Data
US 2010/0301361 A1  Dec. 2, 2010

(30) Foreign Application Priority Data
May 28, 2009  (CN) .......................... 2009 1 0039912

(51) Int. Cl.
*H01L 33/00* (2010.01)
(52) U.S. Cl. .................... 257/99; 257/100; 257/E33.059
(58) Field of Classification Search ............ 257/98–100; 362/364, 365, 632, 217.1, 240; D13/180
See application file for complete search history.

(56) References Cited

U.S. PATENT DOCUMENTS

| | | | | |
|---|---|---|---|---|
| 2006/0138437 A1* | 6/2006 | Huang et al. | ..................... | 257/98 |
| 2007/0176193 A1* | 8/2007 | Nagai | ............................. | 257/98 |
| 2008/0186733 A1* | 8/2008 | Ho et al. | ....................... | 362/610 |

* cited by examiner

*Primary Examiner* — Matthew Reames
(74) *Attorney, Agent, or Firm* — Li&Cai Intellectual Property (USA) Office

(57) ABSTRACT

A light emitting diode of the present invention comprises a support frame, a shell, a light emitting diode chip and an encapsulating body. The shell is used to accommodate the support frame. The shell has a bowl-shaped structure and the bowl-shaped structure has two opposite first walls and two opposite second walls. The upper edge of the second wall is a concave-convex structure. The encapsulating body is used to package the bowl-shaped structure and the encapsulating body has a concave-convex structure similar to the concave-convex structure of the bowl-shaped structure. The concave-convex structure comprises a concave portion and a convex portion. The structure of the light emitting diode is simplified. The luminous intensity and the light extraction efficiency of the light emitting diode are enhanced and the thickness of the light emitting diode is not increased.

10 Claims, 3 Drawing Sheets

LIGHT EMITTING DIODE

BACKGROUND OF THE INVENTION

1. Field of the Invention

The present invention relates to a light emitting diode. In particular, the present invention relates to a light emitting diode with high luminous intensity and light extraction efficiency.

2. Description of Related Art

Light emitting diode is widely used for display system, illumination system and so on because of its advantages of long lifetime, small size and light weight. The luminous intensity and light extraction efficiency play an important role on performance of LEDs. Therefore, much effort is taken to improve the luminous intensity and light extraction efficiency of light emitting diode.

In traditional, a convex lens is assembled on LED after being packaged so as to concentrate the light emitted from the diode. Accordingly, the luminous intensity of light emitting diode can be improved. However, the manufacturing cost is increased because of the assembled convex lens. In addition, the height of the LED unit is increased and cannot meet the requirement of small size.

SUMMARY OF THE INVENTION

One particular aspect of the present invention is to provide a light emitting diode. The light emitting diode can project light with high luminous intensity and high light extraction efficiency. The light emitting diode can be applied for a light source of back light modules.

The light emitting diode of the present invention has a shell and an encapsulating body. The shell has a bowl-shaped structure and the bowl-shaped structure has two opposite first walls and two opposite second walls. The second wall has a first concave-convex structure on an upper edge thereof and the encapsulating body has a second concave-convex structure corresponding to the first concave-convex structure.

The concave-convex structure has at least one convex structure and two concave structures, and the total height of the concave-convex structure is no larger than that of a conventional light emitting diode without the concave-convex structure. Furthermore, the concave structures are designed to reduce light-blocked influence by shell and increase light extraction efficiency, and the convex structure is designed to concentrate light and increase luminous intensity. Therefore, the combination of the convex structure and concave structure is applied for improving the luminous intensity and the efficiency as well as the uniformity of light. The shell and the encapsulating body are formed with the concave-convex structure so that the height of the shell and the encapsulating body are not increased. In other words, the thickness of the light emitting diode is not increased. On the other hand, because the height of the encapsulating body is lower than or equal to the height of the shell, the machine-stuck issue is solved when light emitting diode is tested.

For further understanding of the present invention, reference is made to the following detailed description illustrating the embodiments and examples of the present invention. The description is for illustrative purpose only and is not intended to limit the scope of the claim.

DETAILED DESCRIPTION OF THE PREFERRED EMBODIMENTS

Figure 1A:
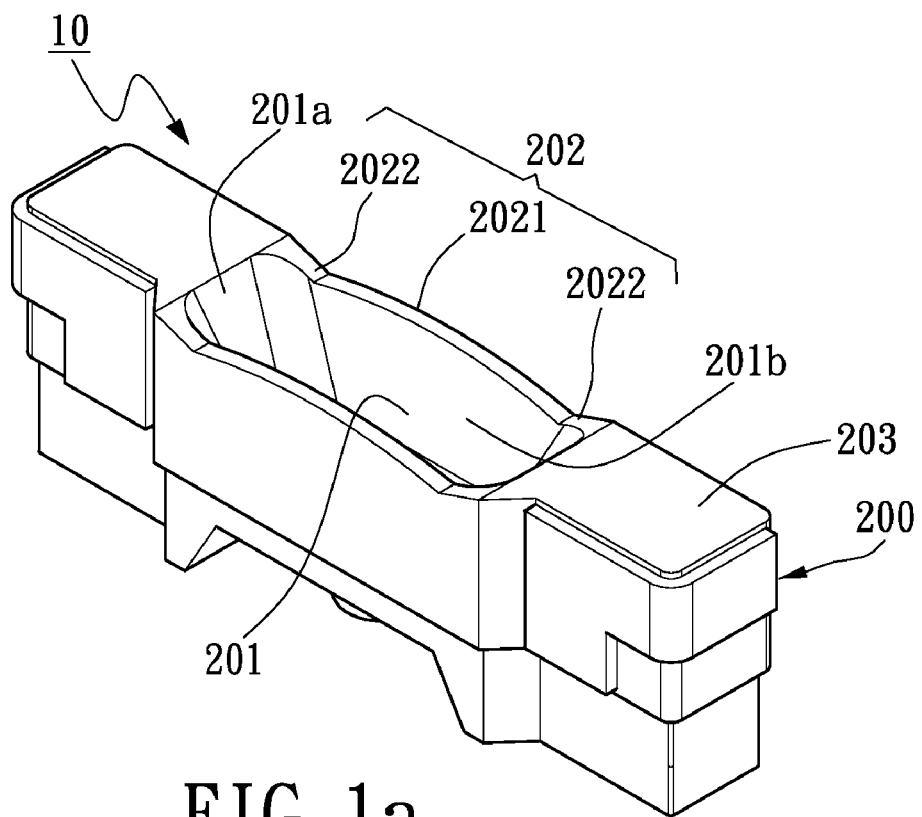
FIG. 1a is a schematic diagram of the first embodiment of the light emitting diode without the packaged encapsulating body of the present invention.
Figure 1B:
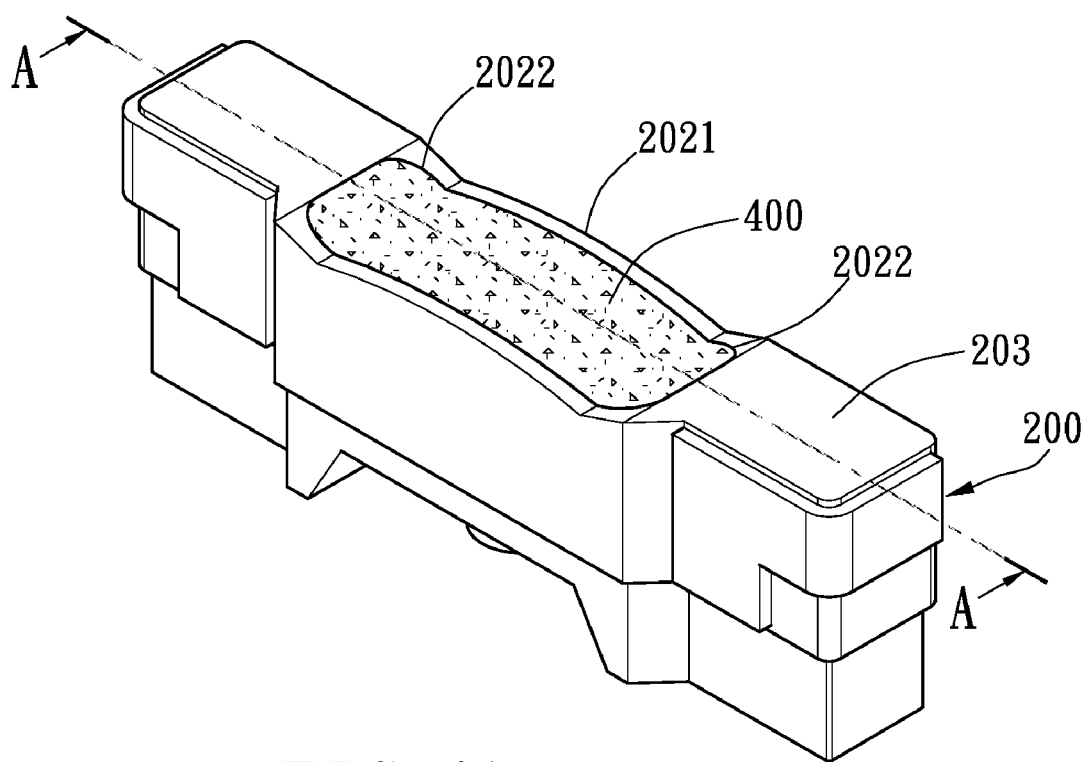
FIG. 1b is a schematic diagram of the first embodiment of the light emitting diode with the packaged encapsulating body of the present invention.
Figure 2:
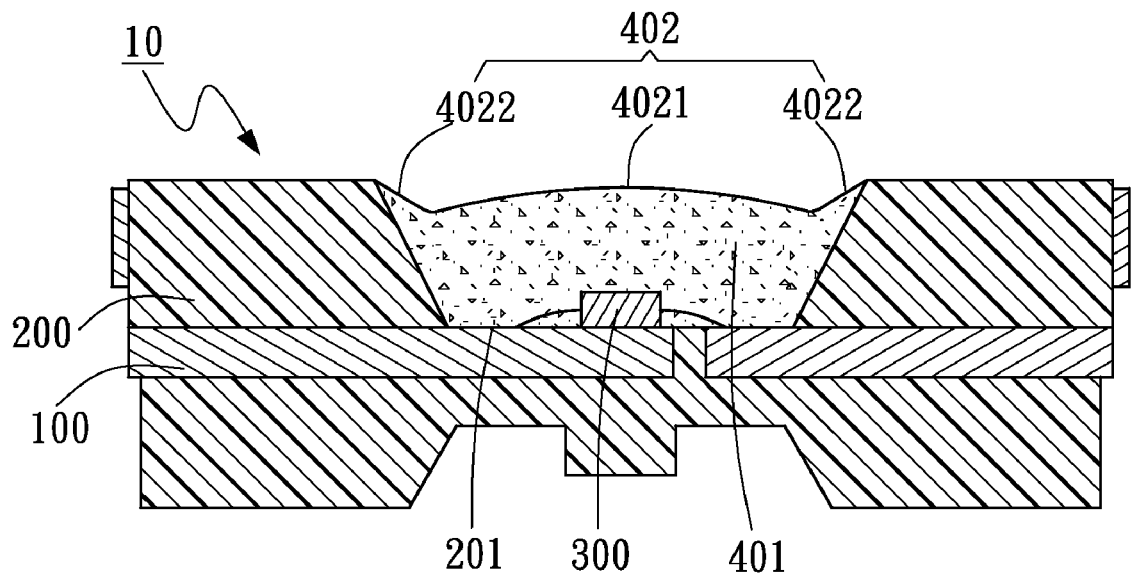
FIG. 2 is a cross-sectional view of the first embodiment of the light emitting diode of the present invention.

Reference is made to FIGS. 1a and 1b. FIGS. 1a and 1b respectively shows the light emitting diode of the first embodiment in the state of without packaged encapsulating body and the state of with packaged encapsulating body. FIG. 2 is a cross-sectional view along the line A-A in FIG. 1b of the first embodiment of the light emitting diode. The light emitting diode 10 includes a lead frame 100, a shell 200, a light emitting diode chip 300 (as shown in FIG. 2) and an encapsulating body 400. The light emitting diode chip 300 is mounted on the support frame 100. The shell 200 is used for accommodating the support frame 100. The shell 200 has a bowl-shaped structure 201 and a platform portion 203 formed on two sides of the bowl-shaped structure 201 respectively. The bowl-shaped structure 201 has two opposite first walls 201a and two opposite second walls 201b. Each of the two second walls 201b has a first concave-convex structure 202 on an upper edge of the second wall 201b. A portion of the support frame 100 is exposed from the bowl-shaped structure 201 and the light emitting diode chip 300 is disposed on the exposed support frame 100 and received in the bowl-shaped structure 201. The encapsulating body 400 is filled into the bowl-shaped structure 201 so as to package the light emitting diode chip 300.

The light generated from the light emitting diode chip 300 is transmitted through the encapsulating body 400 and emitted outside from the surface of the encapsulating body 400 by the reflection of the bowl-shaped structure 201. The structures of the present invention are provided for improving the luminous intensity and light extraction efficiency of the emitting light.

Please refer to FIGS. 1a, 1b and 2; the first concave-convex structure 202 includes one convex structure 2021 and two concave structures 2022. The concave structures 2022 are respectively formed on the two sides of the second wall 201b and each of the two sides of the second wall 201b is adjacent to each of the first walls 201a. The convex structure 2021 is formed between the two concave structures 2022.

The encapsulating body 400 has not only a packaging structure 401 corresponding to the bowl-shaped structure 201 but also an upper surface. The upper surface is a second concave-convex structure 402 constructed of at lease one convex structure 4021 and two concave structures 4022. The convex structure 4021 is formed right over the light emitting diode chip 300 and the two concave structures 4022 of the second concave-convex structure 402 are located respectively on two sides of the convex structure 4021. The top of the second concave-convex structure 402 (i.e., the top of the convex structure 4021) is lower than or equal to the top surface of the platform portion 203 of the shell 200. The above-mentioned structure is provided for preventing the machine-stuck issue when the light emitting diode 10 is tested.

The shape of the second concave-convex structure 402 is similar to the shape of the first concave-convex structure 202. In the embodiment, the first concave-convex structure 202 has a convex structure 2021 and two concave structures 2022 formed on the two sides of the convex structure 2021. Similarly, the second concave-convex structure 402 has a convex structure 4021 and two concave structures 4022 formed on the two sides of the convex structure 4021. The shape of the convex structure 4021 of the second concave-convex structure 402 is defined by the convex structure 2021 of the first concave-convex structure 202 on the second wall 201b so that the shape of the convex structure 4021 of the second concave-convex structure 402 is corresponding to the shape of the convex structure 2021 of the first concave-convex structure 202. The shape of the concave structure 4022 of the second concave-convex structure 402 is also defined by the concave structure 2022 of the first concave-convex structure 202 on the second wall 201b so that the shape of the concave structure 4022 of the second concave-convex structure 402 is corresponding to the shape of the concave structure 2022 of the first concave-convex structure 202.

As mentioned above, the top of the second concave-convex structure 402 (i.e., the top of the convex structure 4021) is lower than or equal to the top surface of the platform portion 203 of the shell 200. Similarly, the top of the first concave-convex structure 202 (i.e., the top of the convex structure 2021) is lower than or equal to the top surface of the platform portion 203 of the shell 200. The first walls 201a and the second walls 201b of the bowl-shaped structure 201 are inclined planes for the reason of efficiency of emitting light. For example, the light emitted from the chip 300 may be reflected by the shell of the light emitting diode and not through the emitting surface (i.e., the upper surface of the encapsulating body 400), the reflected light is then reflected again via the inclined planes of the first walls 201a and the second walls 201b to be emitted out of the emitting surface. Thus, the intensity of the projected light from the emitting surface can be improved.

Figure 3:
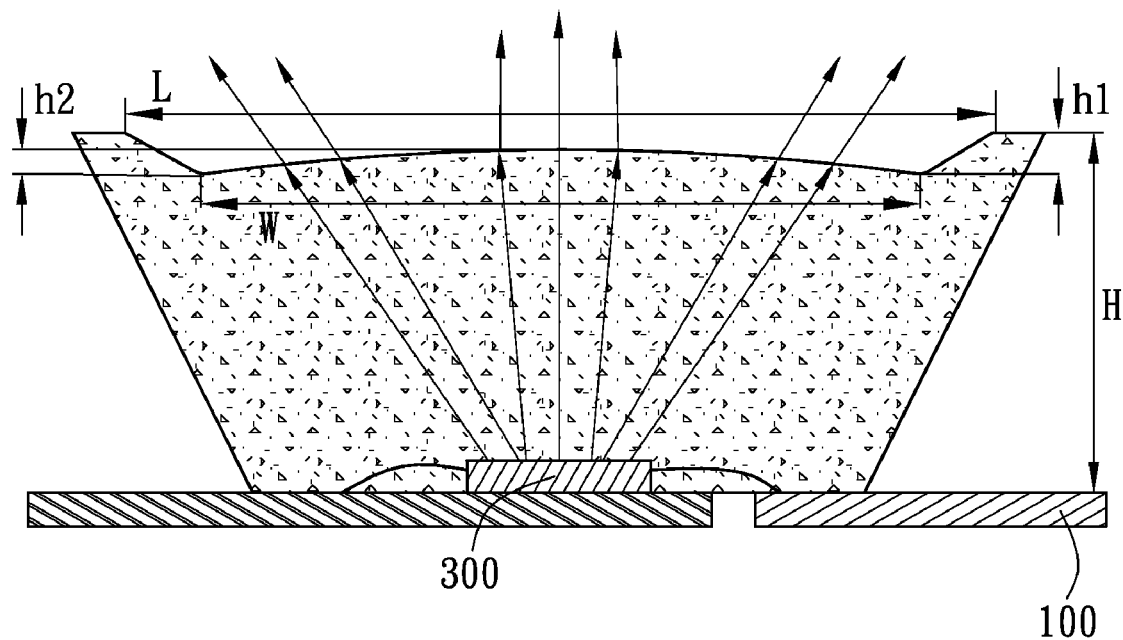
FIG. 3 is a large-view diagram showing a cross-section of the concave-convex structure of the first embodiment of the light emitting diode of the present invention.

FIG. 3 shows the enlarged view of the concave-convex structure of the first embodiment. Please refer to FIG. 3 and Table 1. The depth of the bowl-shaped structure 201 is defined as H, and the width of the bowl-shaped structure 201 is defined as L. The depth calculated from the top surface of the platform portion 203 of the shell 200 to the bottom of the concave structure 2022 or 4022 is defined as h1. The height of the convex structure 2021 or 4021 calculated from the bottom of the concave structure 2022 or 4022 to the top of the convex structure 2021 or 4021 is defined as h2. The width of the convex structure 2021 or 4021 (the distance of the two ends of the convex structure 2021 or 4021) is defined as W. As shown in Table 1, the luminous intensity and luminous flux of the light emitting diode 10 in the first embodiment and a third embodiment described later are obviously improved compared to the prior art. Furthermore, in the case of larger W and h1 (i.e., the larger width of convex structure 2021 or 4021 and the larger depth of concave structure 2022 or 4022), the efficiency as a whole is higher. On the other hand, in the case of the smaller W or the larger h2, the light is most concentrated to increase the light intensity.

TABLE 1

| Type | Iv | lm | VA-S/L |
| --- | --- | --- | --- |
| traditional | 0.000 | 0.000 | 105°/121° |
| First embodiment | +3% | +5% | 108°/119° |
| Third embodiment | +5.3% | +3.2% | 108°/116° |

In Table 1, VA represents view-angle, and VA-S/L represents the view-angle of short-axis divided to the view-angle of long-axis when the light intensity is decreased by 50%. The symbol "+" represents the improvement. Iv represents the light intensity of the light emitting diode 10 per unit area. Im represents the efficiency of the light emitting diode 10 as a whole.

The top of the convex structure 4021 (i.e., the top of the second concave-convex structure 402) is lower than or equal to the top surface of the platform portion 203 of the shell 200. Therefore, h2≦h1.

Please refer to FIG. 2; the second concave-convex structure 402 of the first embodiment has one convex structure 4021 and two concave structures 4022. The width of the convex structure 4021 is much larger than that of the concave structure 4022. In other words, the width of the concave structure 4022 is much smaller than that of the convex structure 4021.

Figure 4:
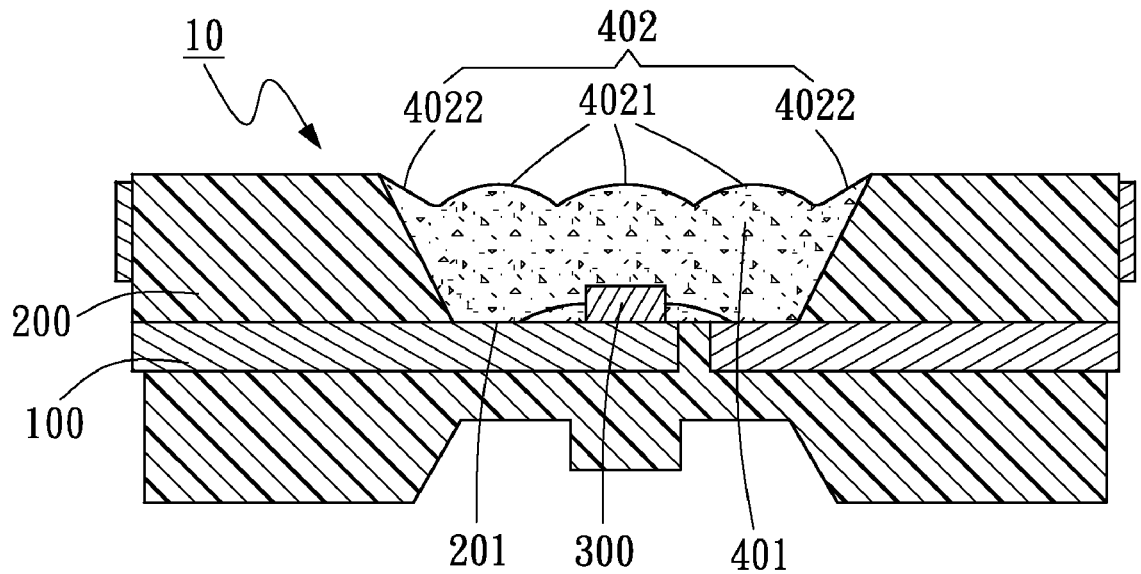
FIG. 4 is a cross-sectional view of the second embodiment of the light emitting diode of the present invention.
Figure 5:
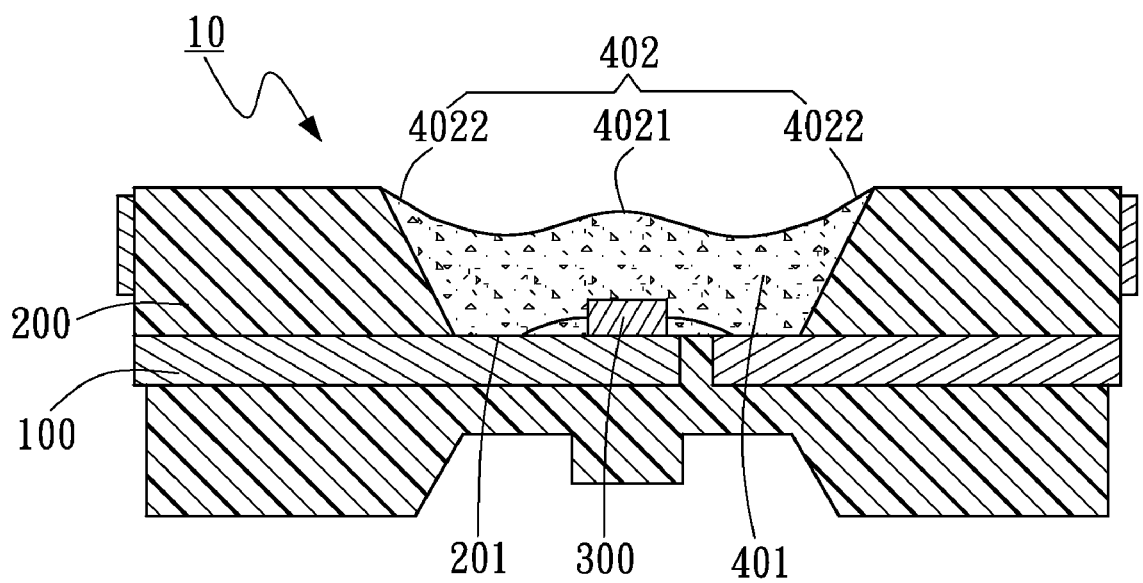
FIG. 5 is a cross-sectional view of the third embodiment of the light emitting diode of the present invention.

Please refer to FIG. 4; the second embodiment of the light emitting diode 10 is shown. The second concave-convex structure 402 has a plurality of convex structures 4021 and two concave structures 4022. The width of the concave structure 4022 is smaller than or equal to a half of the width of convex structure 4021. Please refer to FIG. 5; the third embodiment of the light emitting diode 10 is shown. The second concave-convex structure 402 has one convex structure 4021 and two concave structures 4022. The difference between the first and the third embodiments is that the width of the concave structure 4022 is smaller than or equal to a half of the width of convex structure 4021.

The shape of the first concave-convex structure 202 is similar to and is varied with that of the second concave-convex structure 402 in the first, second and third embodiments. In other words, when the first concave-convex structure 202 has n convex structures 2021 (n≧1) and two concave structures 2022, the second concave-convex structure 402 also has n convex structures 4021 (n≧1) and two concave structures 4022. In detail, there are n−1 concave portions formed in the n convex structures 2021 and there is one concave portion formed between any two adjacent convex structures 2021. Similarly, there are n−1 concave portions formed in the n convex structures 4021 and there is one concave portion formed between any two adjacent convex structures 4021. To achieve the best light emitting performance, the depth of the concave structure 2022 or 4022 (h1) is smaller than or equal to 0.3 times of the depth of the bowl-shaped structure 201 (H), and the height of the convex structure 2021 or 4021 (h2) is smaller than or equal to 0.3 times of the depth of the bowl-shaped structure 201 (H), and the width of the convex structure 2021 or 4021 (W) is larger than or equal to 0.2 times of the width of the bowl-shaped structure 201 (L). Because of the light-concentration of the convex structure 2021 or 4021, the emitted light can be emitted with high concentration so that the light extraction efficiency and luminous intensity of the light emitting diode 10 can be improved.

The description above only illustrates specific embodiments and examples of the present invention. The present invention should therefore cover various modifications and variations made to the herein-described structure and operations of the present invention, provided they fall within the scope of the present invention as defined in the following appended claims.

What is claimed is:

1. A light emitting diode, comprising:
a support frame;
a shell for accommodating the support frame, the shell having a bowl-shaped structure, the bowl-shaped structure having two opposite first walls and two opposite second walls, and each of the two second walls having a first concave-convex structure on an upper edge thereof;
a light emitting diode chip disposed on the support frame;
an encapsulating body packaged in the bowl-shaped structure and corresponding to the bowl-shaped structure, wherein the encapsulating body has an upper surface, the upper surface is a second concave-convex structure, the second concave-convex structure is corresponding to the first concave-convex structure,
wherein the second concave-convex structure has at least one convex structure and two concave structures, the at least one convex structure is formed over the light emitting diode chip, and the two concave structures of the second concave-convex structure are respectively located at two sides of the at least one convex structure,
wherein the shell has a platform portion formed on two sides of the bowl-shaped structure respectively, a top of the at least one convex structure of the first concave-convex structure is lower than or equal to a top surface of the platform portion, and a top of the at least one convex structure of the second concave-convex structure is lower than or equal to the top surface of the platform portion.

2. The light emitting diode as claimed in claim 1, wherein the first concave-convex structure has at least one convex structure and two concave structures, the two concave structures are located on two sides of the second wall and the two sides of the second wall are respectively adjacent to the two opposite first walls, and the at least one convex structure is formed between the two concave structures.

3. The light emitting diode as claimed in claim 1, wherein the first walls and the second walls are inclined planes.

4. The light emitting diode as claimed in claim 1, wherein a depth of the concave structure of the first concave-convex structure is equal to or smaller than 0.3 times of that of the bowl-shaped structure, and a depth of the concave structure of the second concave-convex structure is equal to or smaller than 0.3 times of that of the bowl-shaped structure.

5. The light emitting diode as claimed in claim 1, wherein a height of the convex structure of the first concave-convex structure is equal to or smaller than 0.3 times of a depth of the bowl-shaped structure, and a height of the convex structure of the second concave-convex structure is equal to or smaller than 0.3 times of the depth of the bowl-shaped structure.

6. The light emitting diode as claimed in claim 1, wherein a width of the convex structure of the first concave-convex structure is equal to or larger than 0.2 times of that of the bowl-shaped structure, and a width of the convex structure of the second concave-convex structure is equal to or larger than 0.2 times of that of the bowl-shaped structure.

7. A light emitting diode, comprising:
a support frame;
a shell for accommodating the support frame, the shell having a bowl-shaped structure, the bowl-shaped structure having two opposite first walls and two opposite second walls, and each of the two second walls having a first concave-convex structure on an upper edge thereof;
a light emitting diode chip disposed on the support frame;
an encapsulating body packaged in the bowl-shaped structure and corresponding to the bowl-shaped structure, wherein the encapsulating body has an upper surface, the upper surface is a second concave-convex structure,
wherein the second concave-convex structure has at least one convex structure and two concave structures, the at least one convex structure is formed over the light emitting diode chip, and the two concave structures of the second concave-convex structure are respectively located at two sides of the at least one convex structure,
wherein the shell has a platform portion formed on two sides of the bowl-shaped structure respectively, a top of the at least one convex structure of the first concave-convex structure is lower than or equal to a top surface of the platform portion, and a top of the at least one convex structure of the second concave-convex structure is lower than or equal to the top surface of the platform portion.

8. The light emitting diode as claimed in claim 7, wherein a depth of the concave structure of the first concave-convex structure is equal to or smaller than 0.3 times of that of the bowl-shaped structure, and a depth of the concave structure of the second concave-convex structure is equal to or smaller than 0.3 times of that of the bowl-shaped structure.

9. The light emitting diode as claimed in claim 7, wherein a height of the convex structure of the first concave-convex structure is equal to or smaller than 0.3 times of a depth of the bowl-shaped structure, and a height of the convex structure of the second concave-convex structure is equal to or smaller than 0.3 times of the depth of the bowl-shaped structure.

10. The light emitting diode as claimed in claim 7, wherein a width of the convex structure of the first concave-convex structure is equal to or larger than 0.2 times of that of the bowl-shaped structure, and a width of the convex structure of the second concave-convex structure is equal to or larger than 0.2 times of that of the bowl-shaped structure.

* * * * *